United States Patent
Iwasaki et al.

(10) Patent No.: US 6,856,021 B1
(45) Date of Patent: Feb. 15, 2005

(54) SEMICONDUCTOR DEVICE HAVING ALUMINUM ALLOY CONDUCTORS

(75) Inventors: Tomio Iwasaki, Tsukuba (JP); Hideo Miura, Koshigaya (JP); Takashi Nakajima, Chiyoda (JP); Hiroyuki Ohta, Tsuchiura (JP); Shinji Nishihara, Kokubunji (JP); Masashi Sahara, Hitachinaka (JP)

(73) Assignee: Renesas Technology Corp., Tokyo (JP)

( * ) Notice: Subject to any disclaimer, the term of this patent is extended or adjusted under 35 U.S.C. 154(b) by 438 days.

(21) Appl. No.: 09/648,455

(22) Filed: Aug. 28, 2000

(30) Foreign Application Priority Data

Nov. 1, 1999 (JP) .......................................... 11-310641

(51) Int. Cl.$^7$ .............................................. H01L 23/52
(52) U.S. Cl. ...................................... 257/766; 257/758
(58) Field of Search ................................ 257/758, 751, 257/753, 757, 762, 763, 765, 766

(56) References Cited

U.S. PATENT DOCUMENTS

| | | | | | |
|---|---|---|---|---|---|
| 4,710,398 A | * | 12/1987 | Homma et al. | ............. | 437/235 |
| 5,098,305 A | * | 3/1992 | Krajewski et al. | ............ | 439/75 |
| 6,025,275 A | * | 2/2000 | Efland et al. | ............... | 438/722 |
| 6,063,506 A | * | 5/2000 | Andricacos et al. | ........ | 428/546 |
| 6,239,703 B1 | * | 5/2001 | Friedman et al. | ......... | 340/572.7 |
| 6,306,762 B1 | * | 10/2001 | Nakamura et al. | .......... | 438/648 |
| 6,310,300 B1 | * | 10/2001 | Cooney, III et al. | ........ | 174/258 |
| 6,323,554 B1 | * | 11/2001 | Joshi et al. | .................. | 257/758 |
| 6,326,315 B1 | * | 12/2001 | Uchiyama et al. | .......... | 438/758 |
| 6,383,914 B1 | * | 5/2002 | Yasuda | ....................... | 438/625 |

FOREIGN PATENT DOCUMENTS

| | | | | | |
|---|---|---|---|---|---|
| JP | 359211547 A | * | 11/1984 | .................. | 420/538 |
| JP | 363230845 A | * | 9/1988 | .................... | 21/12 |
| JP | 402206139 A | * | 8/1990 | ................. | 438/537 |
| JP | 06-260642 | | 3/1993 | | |
| JP | 8186175 | | 7/1996 | | |

* cited by examiner

*Primary Examiner*—Eddie Lee
*Assistant Examiner*—Douglas W. Owens
(74) *Attorney, Agent, or Firm*—Antonelli, Terry, Stout & Kraus, LLP

(57) ABSTRACT

A semiconductor device is provided which includes a semiconductor substrate, metal conductors formed on a side of a main face of the substrate, which metal conductors contain aluminum as a main constituent thereof, and copper as an additive element, the metal conductors being made to contain such an element as to suppress the precipitation of copper or being made to have such a film adjacent to the metal conductor as to suppress the precipitation of copper or being made to have such a film adjacent to the metal conductor as to suppress the precipitation of copper.

25 Claims, 10 Drawing Sheets

SEMICONDUCTOR DEVICE HAVING ALUMINUM ALLOY CONDUCTORS

BACKGROUND OF THE INVENTION

This invention relates to a semiconductor device and a method for producing the same.

In recent years, due to the miniaturization of semiconductor devices, the width of metal conductor has tended to become small. Thus, to prevent an aluminum conductor from being broken due to migration and to prevent hillock from occurring due to such migration, a generally employed method has been adding copper of about 0.5% to the aluminum used for the aluminum conductor. However, the spacing of metal conductor portions as well as the metal conductor width also tends to become quite small. Thus, if any precipitate containing copper exists between two of the metal conductor portions, it can become a cause of short fault. To address this problem, it is proposed, in JP-A-8-186175, to adopt a method comprising the steps of forming aluminum film at a high temperature so that copper may be dissolved in the aluminum, and quenching the aluminum film so that the copper may be prevented from being precipitated during the cooling thereof.

SUMMARY OF THE INVENTION

The conventional method in which an aluminum conductor containing copper is formed by use of the quenching treatment, is not sufficient when the spacing between aluminum conductor portions adjacent to each other (hereinafter referred to as "conductor spacing") becomes so narrow as to not be more than 0.4 μm.

Thus, the first object of the invention is to provide a semiconductor device having high reliability.

The second object of the invention is to provide a semiconductor device having a high yield.

The third object of the invention is to provide a semiconductor device having such an interconnect structure that short circuits are unlikely to occur.

The precipitation of copper regarding the aluminum conductor is found to proceed due to the diffusion of copper atoms existing in crystal grain boundaries and in crystal grains. Thus, in order to prevent the precipitation from occurring, it is necessary to suppress the diffusion of the copper atoms existing in the aluminum conductor. After performing intensive research for obtaining means for suppressing the diffusion of the copper atoms, the inventors of the invention have discovered that, by adding an additive to the aluminum conductor, which additive suppresses the diffusion of copper, the precipitation can be prevented.

The subjects of the invention can be solved by a semiconductor device having any one of the following constitutions 1 to 5:

(1) a semiconductor substrate, and an aluminum conductor containing aluminum as the main constituent thereof, which aluminum conductor is provided on the side of one main face of the substrate, the aluminum conductor being made to contain copper and nickel therein. Further, it is preferred that in some region of the semiconductor device, the conductor spacing is not more than 0.4 μm and that the content of nickel is not less than 0.02 at. % but not more than 1 at. %.

(2) a semiconductor substrate, an aluminum conductor containing aluminum as the main constituent thereof, which aluminum conductor is provided on the side of one main face of the substrate, and an adjacent film (barrier film) adjacent to the aluminum conductor, which adjacent film contains titanium and titanium nitride as the main constituents thereof, the, aluminum conductor being made to contain copper and nickel therein. Further, it is preferred that, in some region of the semiconductor device, the conductor spacing is not more than 0.4 μm and that the content of the nickel is not less than 0.02 at. % but not more than 1 at. %;

(3) a semiconductor substrate, and an aluminum conductor containing aluminum as the main constituent thereof, which aluminum conductor is provided on the side of one main face of the substrate, the aluminum conductor being made to contain copper and silicon therein. Further, it is preferred that, in some region of the semiconductor device, the conductor spacing is not more than 0.4 μm and that the content of the silicon is not less than 0.05 at. % but not more than 0.4 at. %;

(4) a semiconductor substrate, an aluminum conductor containing aluminum as the main constituent thereof, which aluminum conductor is provided on the side of one main face of the substrate, and an adjacent film (barrier film) adjacent to the aluminum conductor which adjacent film contains titanium and titanium nitride as the main constituents thereof, the aluminum conductor being made to contain copper and silicon therein; and (5) a semiconductor substrate, an aluminum conductor containing aluminum as the main constituent thereof, which aluminum conductor is provided on the side of one main face of the substrate, and an adjacent film (barrier film) adjacent to the aluminum conductor, which adjacent film contains one kind selected from the group consisting of ruthenium, platinum and iridium as the main constituent thereof, the aluminum conductor being made to contain copper. Further, it is preferred that nickel not less than 0.02 at. % but not more than 1 at. % is contained in the aluminum conductor and that silicon not less than 0.05 at. % but not more than 0.4 at. % is contained in the aluminum conductor.

In the specification, the term main constituent of the metal conductor means a component contained in the metal conductor, the amount of which component is the largest one of all components in the metal conductor.

DETAILED DESCRIPTION OF THE
PREFERRED EMBODIMENTS OF THE
INVENTION

The embodiments of the invention are explained in detail below with reference to the drawings.

Figure 1:
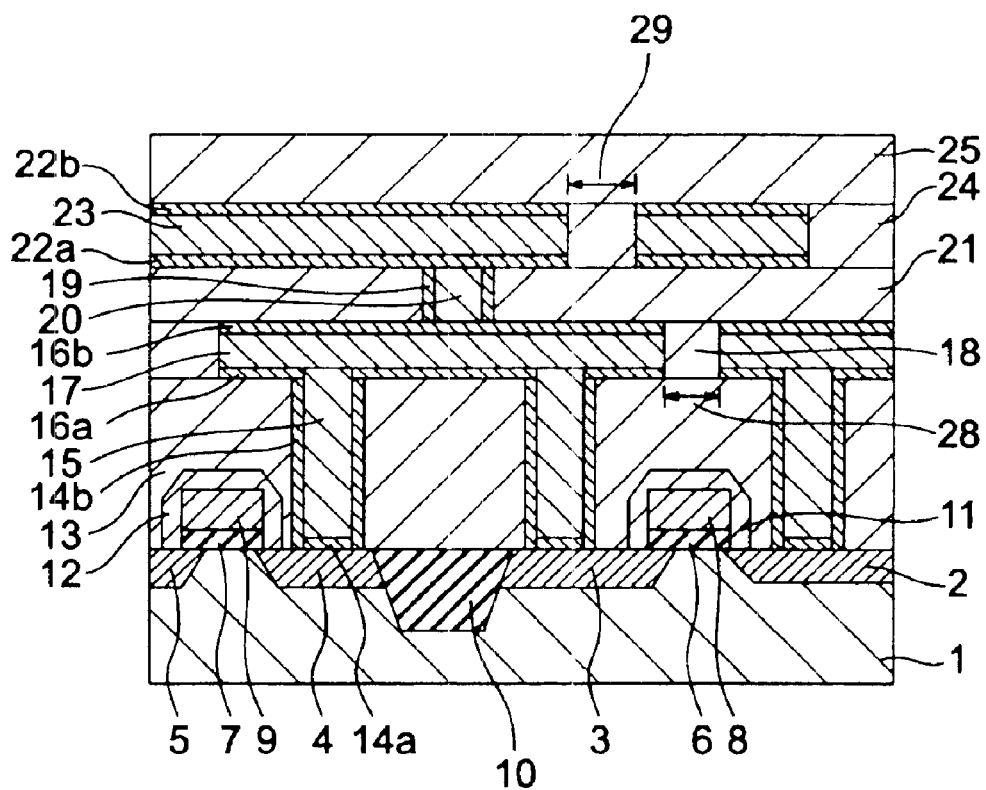
FIG. 1 is a sectional view of the main part of a semiconductor device according to the first embodiment of the invention.

First, the sectional structure of the main part of a semiconductor device according to the first embodiment of the invention is shown in FIG. 1. In the semiconductor device according to the first embodiment, as shown in FIG. 1, diffusion layers 2, 3, 4 and 5 are formed on a silicon substrate 1. Gate dielectrics 6 and 7 and gate electrodes 8 and 9 are formed on the layers 2 through 5, so that MOS transistors are formed. Each of the gate dielectrics 6 and 7 is, for example, made of silicon oxide film or silicon nitride film, and each of the gate electrodes 8 and 9 is, for example, made of polycrystalline silicon film or metal thin film or metal silicide film or a layered structure of these films. The MOS transistors are separated by an isolation film 10 of, for example, silicon oxide film. On the upper portion and side wall of the gate electrodes 8 and 9, there are formed insulating films 11 and 12 which are made of, for example, silicon oxide film. On the whole, an insulating film 13 is formed on upper faces of the MOS transistors. This insulating film 13 is made of, for example, BPSG (Boron-Doped Phospho Silicate Glass) film, or SOG (Spin On Glass) film, or silicon oxide or silicon nitride film formed by a chemical vapor deposition method or a sputtering method. In contact holes formed in the insulating film 13, there are formed plugs, each comprising a main conductive film 15 coated with adjacent conductive film 14a, 14b (first conductive film) for preventing diffusion, each of which plugs is connected to each of the diffusion layers 2, 3, 4 and 5. To the plugs is connected a first layered interconnection comprising a main conductive film 17 coated with adjacent conductive films 16a and 16b for preventing diffusion. The layered interconnection is, for example, provided by the steps of forming the main conductive film 17 by use of a sputtering process after having formed the adjacent conductive film 16a by the sputtering process, forming thereon the adjacent conductive film 16b by the sputtering process, and forming an interconnect pattern by the etching thereof. If precipitates containing copper remain during the etching without being removed, a short is likely to occur in a case where the conductor spacing 28 is narrow. On the first layered interconnection, plugs, each comprising a main conductive film 20 coated with an adjacent conductive film 19, are formed in contact holes formed in insulating film 21. To these plugs is connected the second layered interconnection which comprises a main conductive film 23 coated with adjacent conductive films 22a and 22b. The second layered interconnection is, for example, provided by the steps of forming the main conductive film 23 by sputtering after having formed the adjacent conductive film 22a by sputtering, forming thereon the adjacent conductive film 22b by sputtering, and forming an interconnect pattern by the etching thereof.

The materials of the main conductive film 17 and the main conductive film 23 respectively provided in 10 the first and second layered interconnections are, for example, aluminum, in which copper is added to provide good migration resistance. In this embodiment, in order for shorts not to occur due to the precipitation of copper, even in the case where the conductor spacings 28 and 29 are not more than 0.4 $\mu$m, at least one material selected from the group consisting of nickel and silicon is added to each of the main conductive film 17 and the main conductive film 23. As a method for adding these materials, sputtering using a target of an alloy or multi-sputtering using a plurality of targets can be used. As regards the contents of copper, nickel and silicon, they are explained below in connection with the effect brought about in the embodiments of the invention.

For explaining in detail the effect brought about in the embodiments, there are shown analysis examples by use of molecular dynamics simulation. The molecular dynamics simulation is, as disclosed, for example, in Journal of Applied Physics Vol. 54, pages 4864 to 4878, issued in 1983, a method in which force acting on each of atoms is calculated through potential among the atoms and in which, by solving Newton's Equation of Motion, the location of each atom at each time is calculated.

In this embodiment, by calculating the interaction among different elements by introducing the transfer of electric charge in the above-explained molecular dynamics, the relations explained below can be obtained.

The main effect of this embodiment is to make it possible to prevent the precipitation of copper by adding nickel and/or silicon, noting that the fact that the adding of copper is effective for preventing the migration had been already known. However, in order to restrict the content of copper to a proper value, the dependence of the migration-preventing effect upon the copper content is disclosed at first. The "migration" is a phenomenon that aluminum atoms are diffused due to the influences of heat, stress and electric current with the result that voids and/or hillocks are caused. The larger the diffusion coefficient is, the more likely migration is apt to occur. Thus, the migration-preventing effect can be shown by the rate of decrease in the diffusion coefficient. As regards the method for calculating the diffusion coefficient by use of the molecular dynamics simulation, this is disclosed in Physical Review B Vol. 29 (issued in 1984), pages 5363 to 5371.

Figure 2:
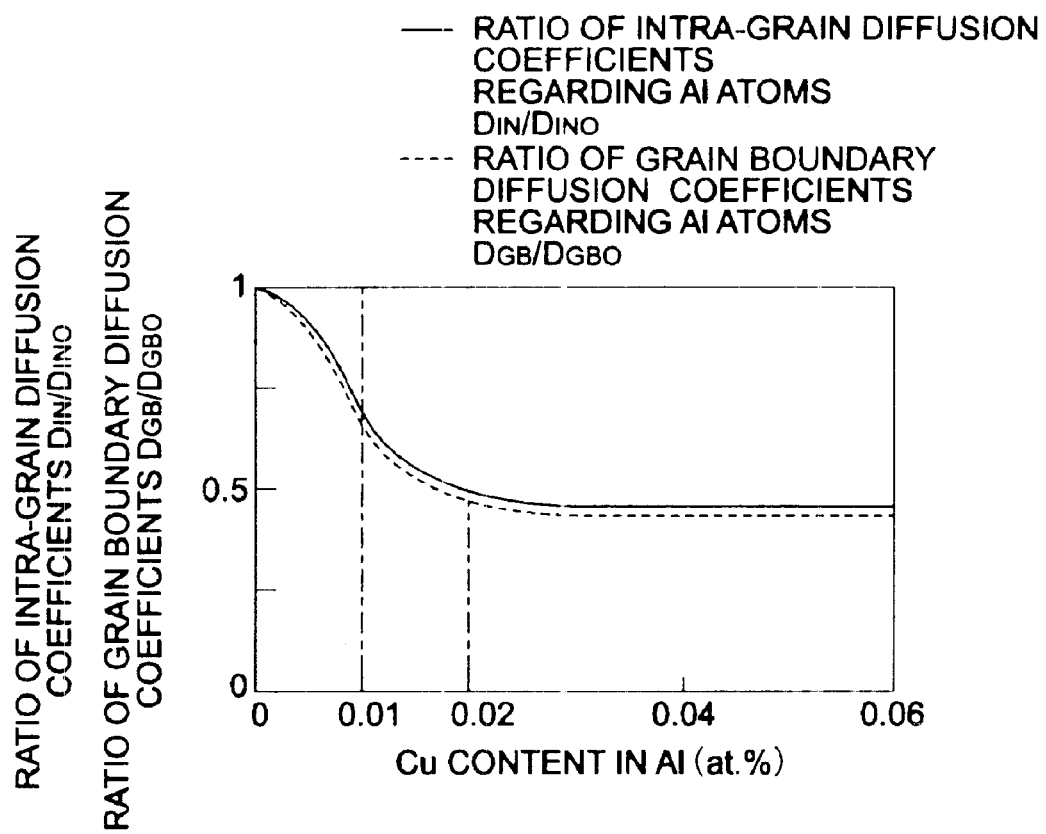
FIG. 2 is a graph showing the dependence of the diffusion coefficient of aluminum upon copper content with respect to a low content range of copper.
Figure 3:
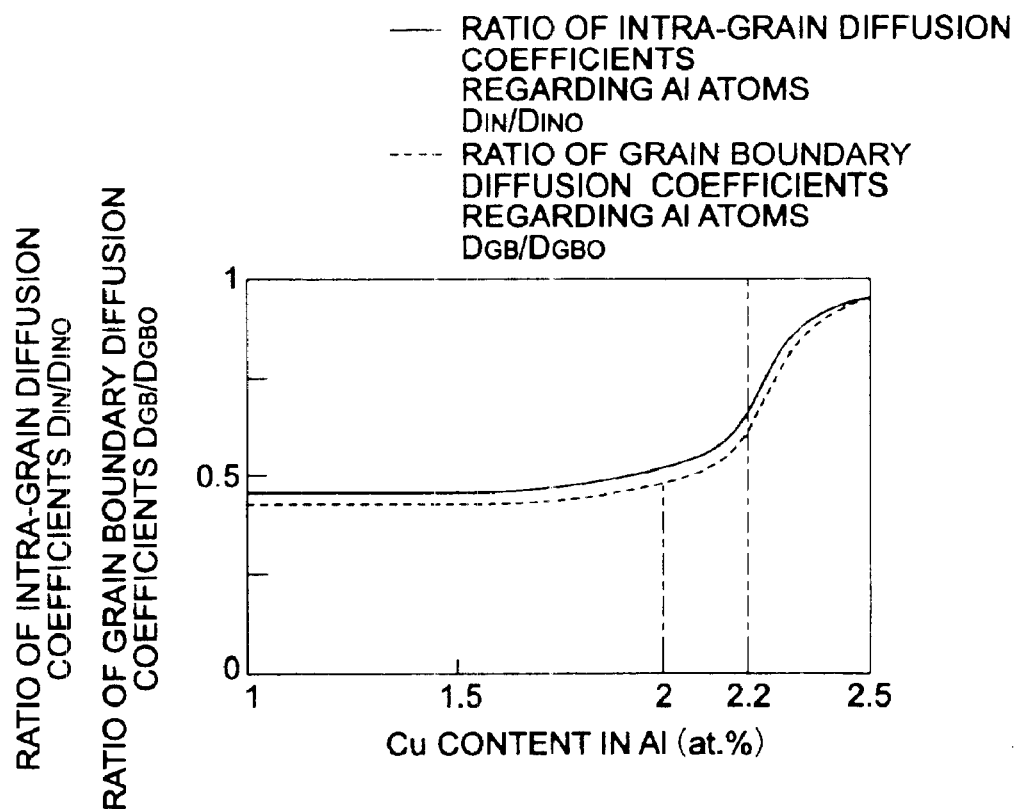
FIG. 3 is a graph showing the dependence of the diffusion coefficient of aluminum upon copper content with respect to a high content range of copper.

In FIGS. 2 and 3 discloses the results of analyzing the dependence of the gain boundary diffusion coefficient DGB of aluminum atoms, existing in the grain boundaries of the aluminum crystalline structure, upon the content of copper, and the dependence of the intra-grain diffusion coefficient DIN of aluminum atoms existing in the interior of aluminum crystalline upon the content of copper. In FIGS. 2 and 3, the results are shown while marking with $D_{GBO}$ and $D_{INO}$ the grain boundary diffusion coefficient and the intra-grain diffusion coefficient both in the case of no copper being added, respectively. As is apparent from FIG. 2, the diffusion-suppressing effect becomes remarkable when the copper content becomes not less than 0.01 at. %, and this effect becomes saturated when the copper content is 0.02 at. %. Further, as is apparent from FIG. 3, the diffusion-suppressing effect becomes lowered when the copper content exceeds 2 at. %. This occurs because, if the additives are excessively added, the crystal structure of aluminum, which is the main constituent, is disturbed with the result that the diffusion becomes active. Thus, in order to enhance the migration resistance, the copper content is preferred to be not less than 0.02 at. % but not more than 2 at. %. These are the results of the analysis at 700° K. at which copper is in a solid solution state in the aluminum crystalline structure. In the case of 500° K., although the precipitation of copper is observed, the Cu-adding effect can be shown similarly even in this case. Further, even at other temperatures, similar effects can be also shown.

Figure 4:
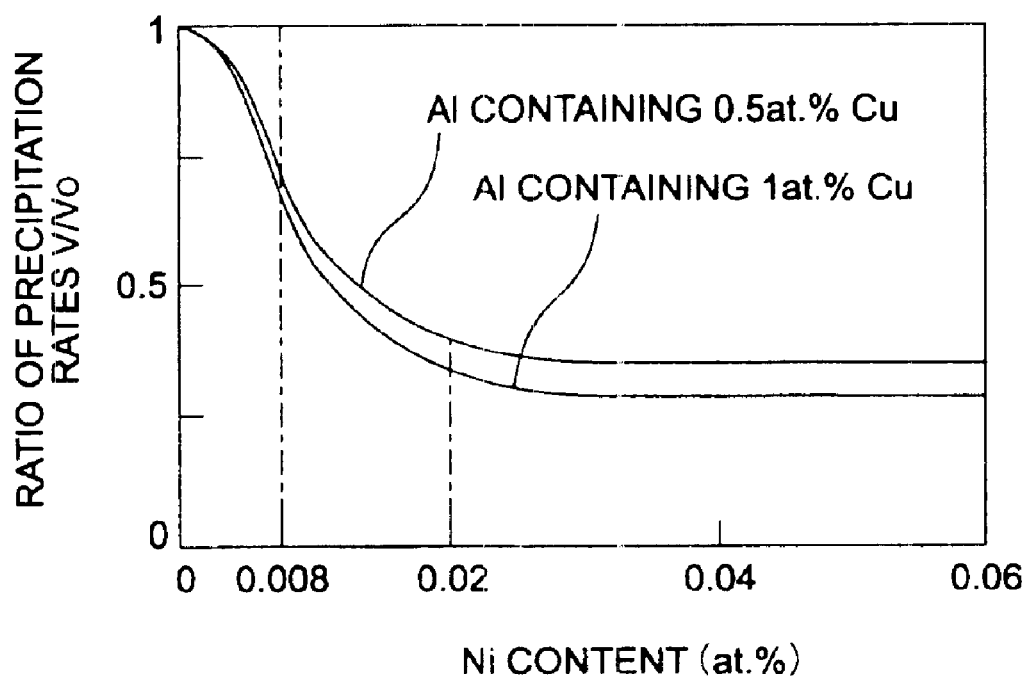
FIG. 4 is a graph showing the dependence of the precipitation rate of copper upon nickel content with respect to a low content range of nickel.
Figure 5:
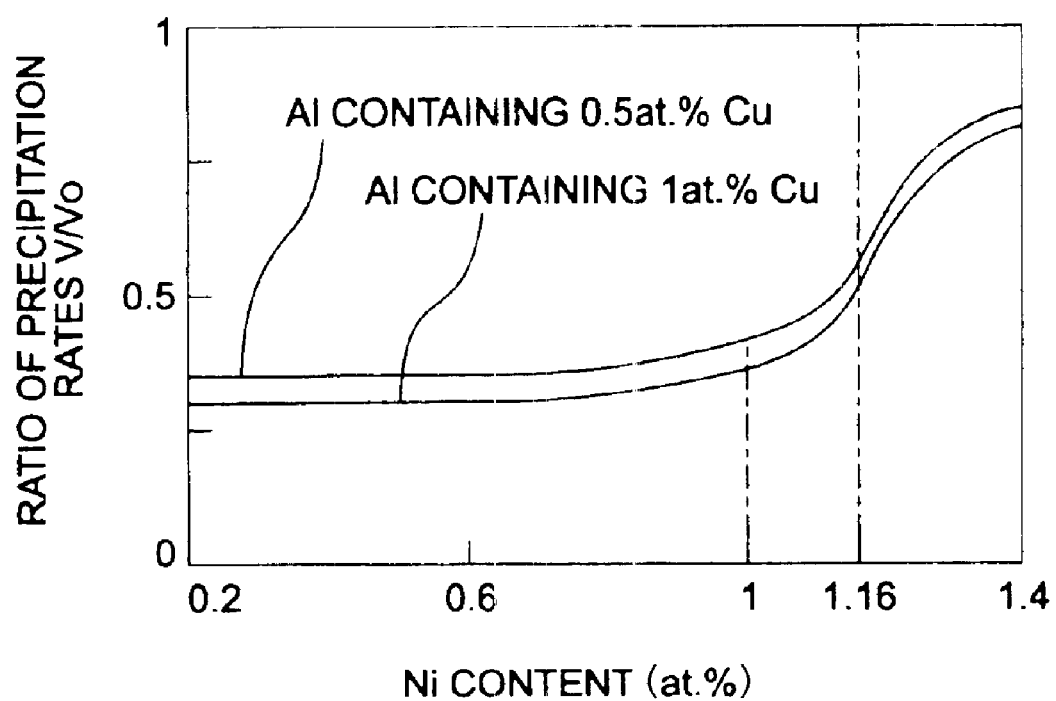
FIG. 5 is a graph showing the dependence of the precipitation rate of copper upon nickel content with respect to a high content range of nickel.

Next, the effect of preventing copper from being precipitated in a case of adding nickel is explained below. In order to do this, a simulation was performed in which copper was precipitated while setting the temperature at 500° K. The results of analyzing the dependence of the precipitation rate V upon nickel content are shown in FIGS. 4 and 5. In FIGS. 4 and 5, the precipitation rate in a case where no nickel was added is marked as "$V_0$". The precipitation rate in the simulation means such a rate as, at portions in the aluminum crystalline structure where copper atoms gathered, other copper atoms further gather, and is defined as the number of copper atoms gathering for a unit period of time. As shown in FIG. 4, when the nickel content becomes not less than 0.008 at. %, the effect of preventing the precipitation of copper becomes remarkable. The effect becomes substantially saturated when the nickel content is 0.02 at. %. Further, as apparent in FIG. 5, when the nickel content exceeds 1 at. %, the effect of preventing the precipitation of copper becomes small. Thus, in order to prevent the precipitation of copper, it is preferred that the nickel content is not less than 0.02 at. % but not more than 1 at. %.

Figure 6:
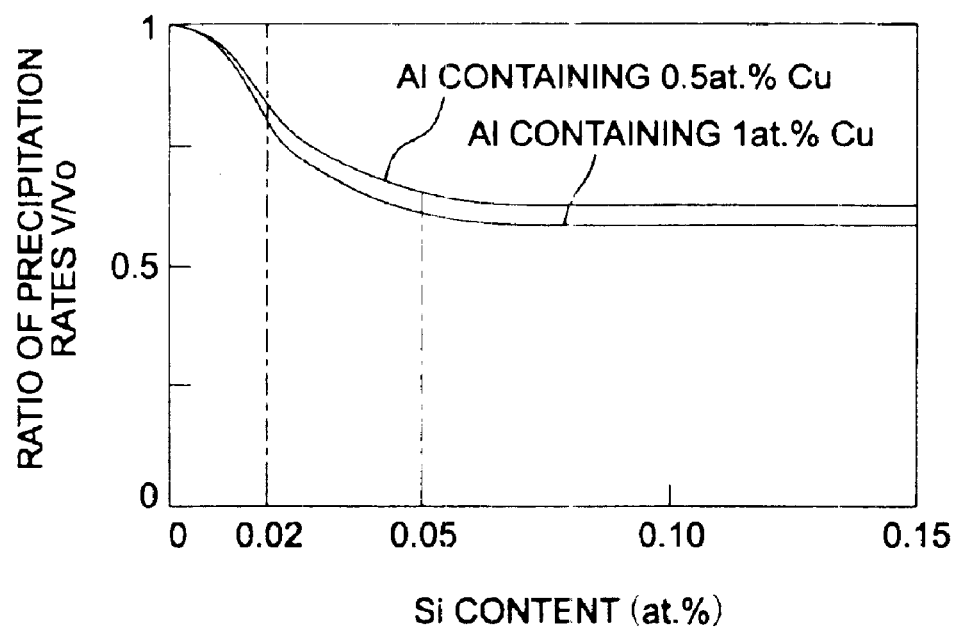
FIG. 6 is a graph showing the dependence of the precipitation rate of copper upon silicon content with respect to a low content range of silicon.
Figure 7:
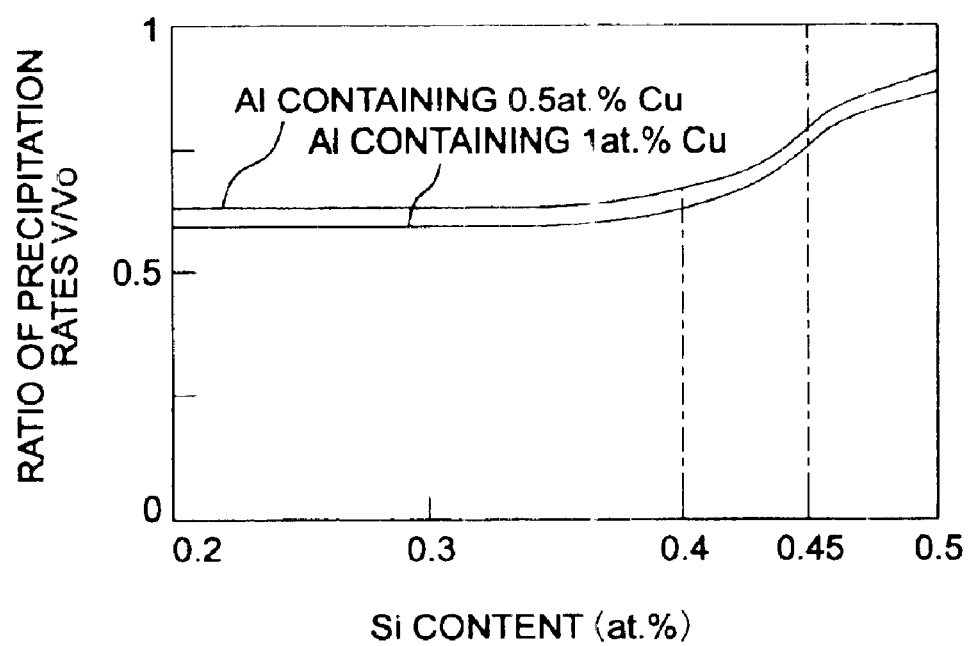
FIG. 7 is a graph showing the dependence of the precipitation rate of copper upon silicon content with respect to a high content range of silicon.

Next, the effect of preventing copper from being precipitated in a case of adding silicon is explained below. A simulation was performed in which copper was precipitated while setting the temperature at 500° K. The results of analyzing the dependence of the precipitation rate V upon silicon content are shown in FIGS. 6 and 7. In FIGS. 6 and 7, the precipitation rate in a case where no silicon was added is marked as "$V_0$". As shown in FIG. 6, when the silicon content becomes not less than 0.02 at. %, the effect of preventing the precipitation of copper becomes remarkable. The effect becomes substantially saturated when the silicon content is 0.05 at. %. Further, as is apparent in FIG. 7, when the silicon content exceeds 0.4 at. %, the effect of preventing the precipitation of copper becomes small. Thus, in order to prevent the precipitation of copper, it is preferred that the silicon content is not less than 0.05 at. % but not more than 0.4 at. %.

Incidentally, in prior art arrangements, in order to prevent an aluminum conductor from absorbing silicon atoms from the silicon substrate and/or the silicon oxide film, it had been known to add silicon of about 1 at. % to the aluminum conductor. However, it is impossible to prevent the precipitation of copper insofar as this amount of the conventionally added silicon is concerned.

In the case of a temperature other than 500° K., the effects of nickel and silicon can also be shown 25 insofar as the temperature is such that the copper can be precipitated. At a temperature of not more than 350° K., the rate of precipitation of copper became very slow in rate so that it was impossible to confirm the precipitation of copper in the simulation. Further, in another case where the temperature becomes such a high temperature as to be not less than 550° K., copper is apt to be dissolved, so that the precipitation thereof hardly occurs. In the range between 350° K and 550° K., the precipitation of copper is most apt to occur. Thus, in order to prevent the precipitation of copper, it is preferable to combine the method of adding nickel and/or silicon and the method of quenching down to a temperature not more than 350° K. after forming a film at another temperature not less than 550° K. In the specification, the term "quenching" means a cooling performed at a rate larger than the rate of natural cooling occurring by leaving a sample as it is. In order to perform the quenching, there are used, for example, gases or fluids for cooling. Further, in order to realize, prior to quenching, a state in which copper is sufficiently dissolved, it is preferred to perform the quenching after keeping a high temperature for a period of time of, for example, not less than 5 seconds, following the completion of the deposition of the atoms. In a case where a heat treatment is performed before forming an interconnection pattern by etching etc., after the quenching, it is preferred to perform the heat treatment at such a high temperature as to be not less than 550° K. and to perform the quenching when cooling.

In comparing FIG. 4 with FIG. 6, it is found that nickel is more effective than silicon regarding the precipitation-preventing effect. Further, it becomes possible to make the aluminum conductor lower in resistance in the case of adding nickel than in the case of adding silicon. On the other hand, the addition of silicon has such an effect as to prevent the aluminum conductor from absorbing silicon atoms from the silicon substrate and/or the silicon oxide film.

Figure 8:
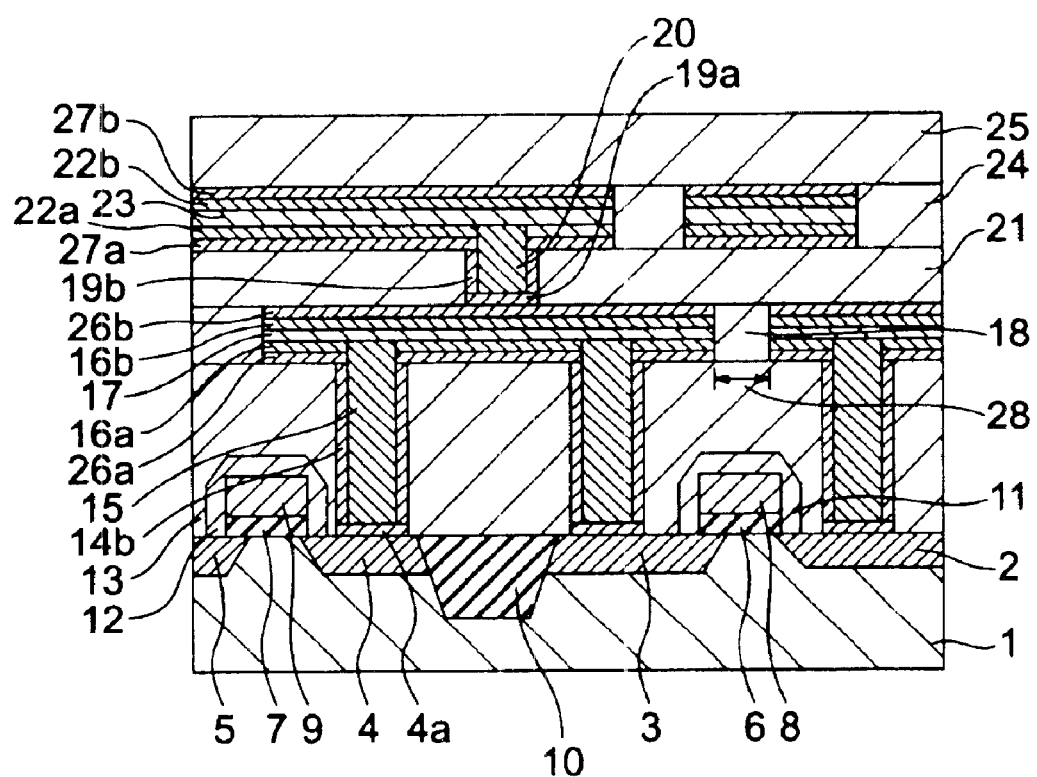
FIG. 8 is a sectional view of the main part of another semiconductor device according to the second embodiment of the invention.

Next, regarding another semiconductor device relating to the second embodiment of the invention, the sectional structure of the main parts thereof is shown in FIG. 8. The difference between the second embodiment and the first embodiment resides in that, in the first and second layered interconnections, other barrier films 26a and 26b; 27a and 27b are formed outside of the barrier films 16a and 16b; 22a and 22b of the main conductive films 17 and 23, respectively. Alternatively, although not shown in the drawings, other barrier films of at least one layer may be formed at the outside of the outermost films. Further, the numbers of the layers of the barrier films regarding each of the main conductive films 17 and 23 may be different from each other. In addition, the number of each of the upper and lower layers of the barrier films each provided regarding the main conductive films 17 and 23 may be different from each other. In the case where each of the main conductive films 17 and 23 is made of an aluminum alloy containing copper as an additive, the feature that nickel and/or silicon is preferably added therein to prevent the precipitation of copper is the same as in the first embodiment.

Figure 9:
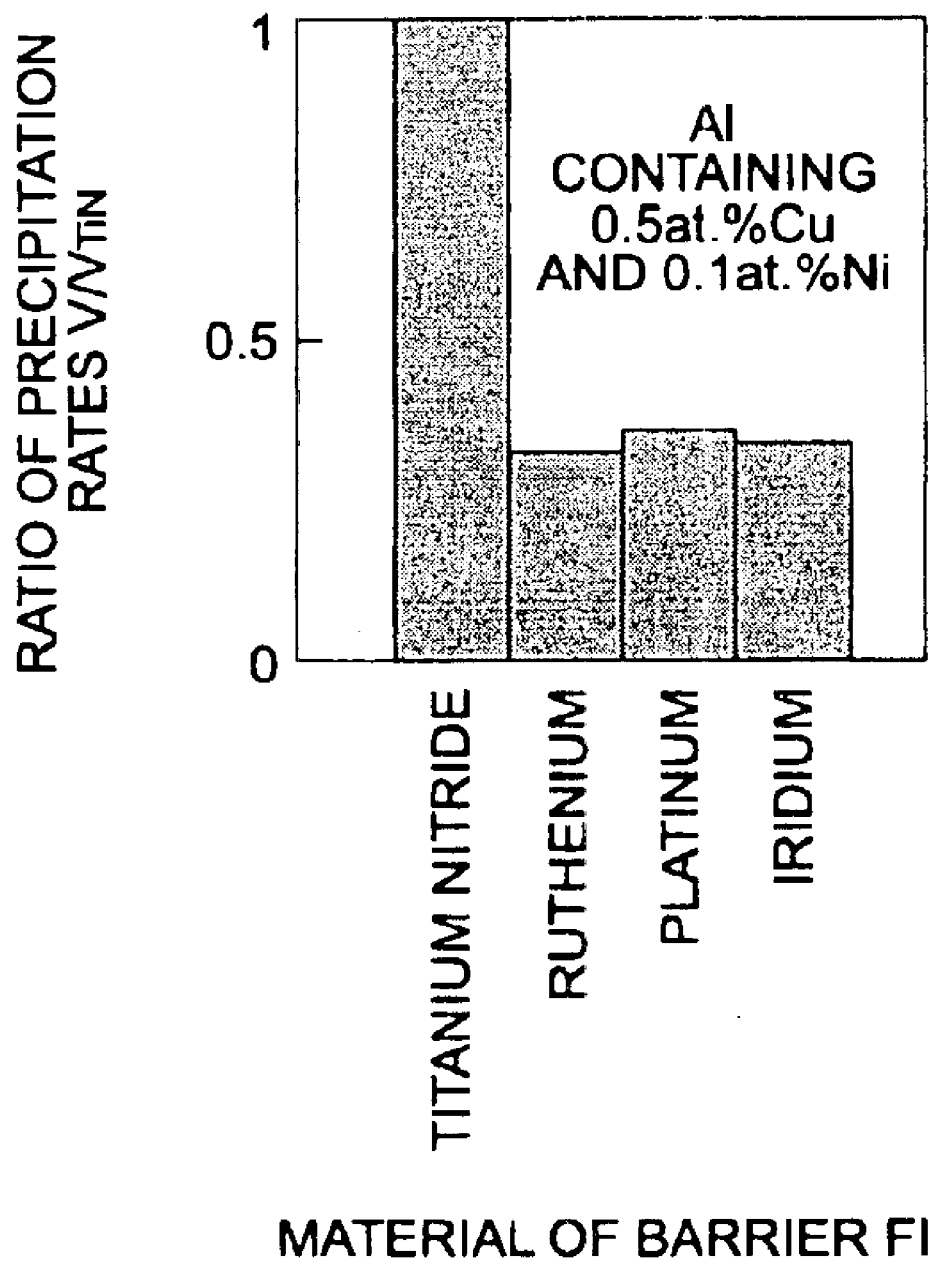
FIG. 9 is a graph showing the dependence of copper precipitation rate upon the kind of materials used for a barrier film in a case where an aluminum film containing copper and nickel is in contact with the barrier film.
Figure 10:
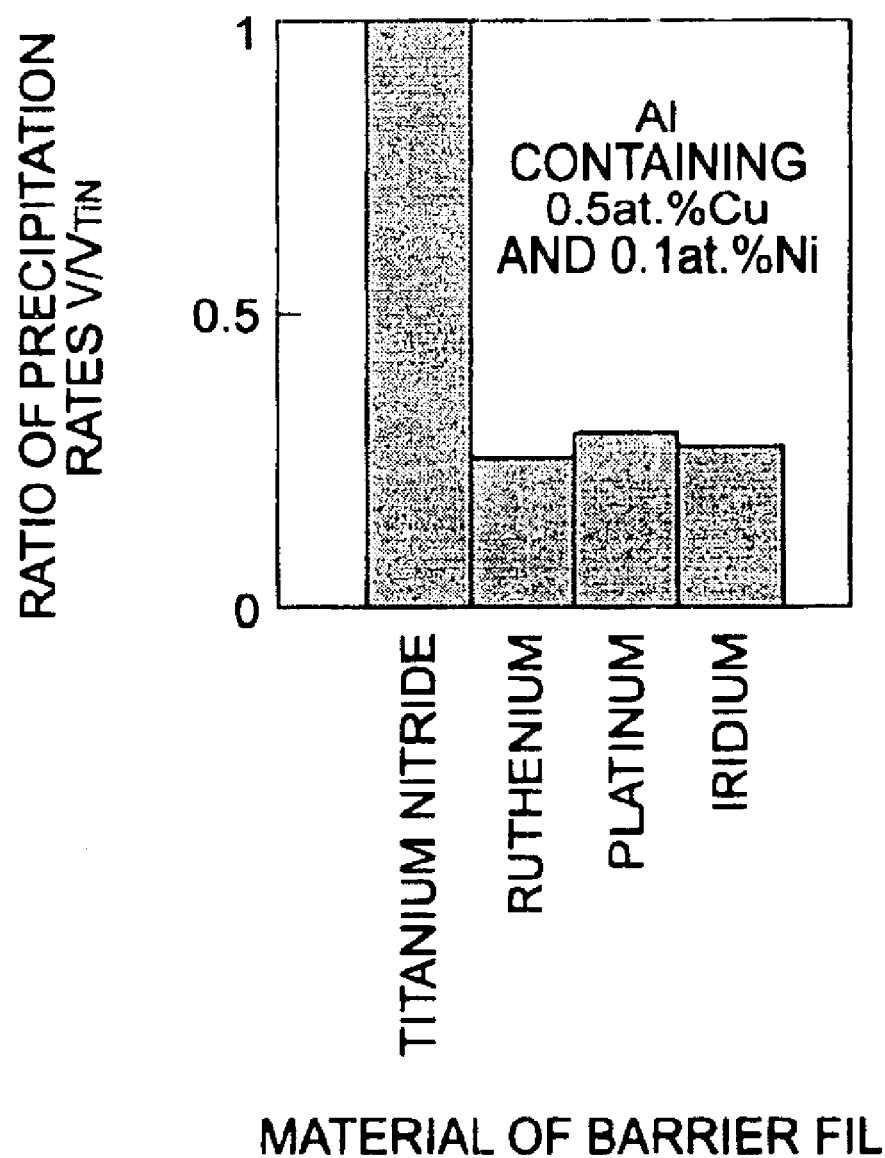
FIG. 10 is a graph showing the dependence of copper precipitation rate upon the kind of materials used for the barrier film in a case where an aluminum film containing copper and silicon is in contact with the barrier film.

In order to make the copper precipitation even less likely to occur, it is preferred that the main constituent of each of the barrier films 16a, 16b, 22a and 22b is a material selected from the group consisting of ruthenium, platinum and iridium. The effect brought about by using such material selected from the group consisting of ruthenium, platinum and iridium as a barrier film is explained below. In FIGS. 9 and 10 are shown the results of analyzing the precipitation rate of copper in a case of making the barrier film come into contact with the aluminum film. In FIG. 9, the results are shown in a case where the copper and nickel contents are 0.5 at. % and 0.1 at. %, respectively. In FIG. 10, the results are shown in another case where the copper and silicon contents are 0.5 at. % and 0.1 at. %, respectively. In FIGS. 9 and 10, the precipitation rate in the case of using titanium nitride as a usually used barrier film is set to be $V_{TIN}$. From FIGS. 9 and 10, it is apparent that, in the case where material selected from the group consisting of ruthenium, platinum and iridium is used as the material of the barrier film, the precipitation of copper is more suppressed in comparison with the case of using titanium nitride as the barrier film. When using material selected from the group consisting of ruthenium, platinum and iridium as the barrier films 16a, 16b, 22a and 22b, it is preferred to use, for improving the adhesion thereof to the insulating films 13, 21 and 25, the films of titanium nitride or titanium, or layered film thereof as the barrier films 26a, 26b, 27a and 27b. As regards the main conductive film of the plugs, aluminum in which copper and nickel are added or in which copper and silicon are added may be used, or another material such as, for example, tungsten or silicon may be used. Further, without using the copper-and-nickel-added aluminum or the copper-and-silicon-added aluminum regarding the whole of the film for forming the interconnection, a part of the whole film may be formed by use of one of these Al alloys.

According to the invention, it becomes possible to provide a semiconductor device having high reliability, to provide a semiconductor device having high yield, and to provide a semiconductor device having such an interconnection structure that shorts are highly unlikely to occur.

What is claimed is:

1. A semiconductor device comprising a semiconductor substrate, and aluminum conductors formed in a plurality of layers on a portion of a main face of the substrate which aluminum conductors comprise aluminum as a main constituent thereof, said aluminum conductors containing copper and nickel to suppress diffusion of said copper between said aluminum conductors,
   wherein said aluminum conductors each have at least one area in which conductor spacing between each said aluminum conductor and an adjacent aluminum conductor is not more than 0.4 µm,
   wherein the content of nickel contained in said aluminum conductors is not less than 0.02 at. % but not more than 1 at. %.

2. A semiconductor device comprising a semiconductor substrate, and a plurality of aluminum conductors formed adjacent to one another on a portion of a main face of the substrate which aluminum conductors comprise aluminum as a main constituent thereof, a film adjacent to said aluminum conductors which adjacent film comprises titanium or titanium nitride as a main constituent thereof, said aluminum conductors containing copper and nickel.

3. A semiconductor device according to claim 2,
   further comprising an insulating film overlying said aluminum conductors on said portion of a main face of the substrate.

4. A semiconductor device according to claim 2, wherein an interconnect pattern of the aluminum conductors is formed by being etched, and the nickel in the aluminum conductors is of a sufficient amount to prevent a precipitation of the copper in the aluminum conductors so that precipitate containing copper is prevented from remaining during the etching to prevent a short in the interconnect pattern caused by the precipitate containing the copper.

5. A semiconductor device according to claim 4, wherein said aluminum conductors have at least one area in which conductor spacing is not more than 0.4 µm.

6. A semiconductor device according to claim 2, wherein said aluminum conductors have at least one area in which conductor spacing is not more than 0.4 µm.

7. A semiconductor device comprising a semiconductor substrate, and aluminum conductors formed on a portion of a main face of the substrate which aluminum conductors comprise aluminum as a main constituent thereof, said aluminum conductors having at least one area in which conductor spacing is not more than 0.4 µm, a film adjacent to said aluminum conductors which adjacent film comprises one kind selected from the group consisting of ruthenium, platinum and iridium as main constituent thereof, said aluminum conductors containing copper, wherein said aluminum conductors contain nickel not less than 0.02 at. % but not more than 1 at. %.

8. A semiconductor device according to claim 7,
   wherein said aluminum conductors contain silicon not less than 0.05 at. % but not more than 0.4 at. %.

9. A semiconductor device according to claim 7, further comprising an insulating film overlying said aluminum conductors on said portion of a main face of the substrate.

10. A semiconductor device according to claim 7, wherein said aluminum conductors have at least one area in which conductor spacing is not more than 0.4 µm.

11. A semiconductor device comprising a semiconductor substrate, and aluminum conductors formed on a portion of a main face of the substrate which aluminum conductors comprise aluminum as a main constituent thereof, said aluminum conductors containing copper and nickel, wherein each of the aluminum conductors has at least one area in which conductor spacing is not more than 0.4 µm and wherein the content of nickel contained in said aluminum conductors is not less than 0.2 at. % but not more than 1 at. %.

12. A semiconductor device according to claim 11, wherein said aluminum conductors have at least one area in which conductor spacing is not more than 0.4 µm.

13. A semiconductor device comprising:
    a semiconductor substrate,
    a plurality of aluminum conductors formed adjacent to one another on a portion of a main face of the substrate which aluminum conductors comprise aluminum as a main constituent thereof, said aluminum conductors containing copper;
    means for suppressing diffusion of copper atoms in said aluminum conductors to prevent precipitation of the copper from one of said aluminum conductors to an adjacent one of said aluminum conductors; and
    an insulating film overlying said aluminum conductors on said portion of a main face of the substrate.

14. A semiconductor device according to claim 13, wherein said means for suppressing diffusion of copper atoms comprises nickel added to said aluminum conductors.

15. A semiconductor device according to claim 13, wherein said aluminum conductors have at least one area in which conductor spacing is not more than 0.4 µm.

16. A semiconductor device comprising a semiconductor substrate, and a plurality of aluminum conductors formed adjacent to one another on a portion of a main face of the substrate which aluminum conductors comprise aluminum as a main constituent thereof, said aluminum conductors containing copper and also containing nickel in an amount sufficient to prevent precipitation of said copper between adjacent ones of said aluminum conductors.

17. A semiconductor device according to claim 16 further comprising an insulating film overlying said aluminum conductors on said portion of a main face of the substrate.

18. A semiconductor device according to claim 16, wherein said aluminum conductors have at least one area in which conductor spacing is not more than 0.4 µm.

19. A semiconductor device comprising a semiconductor substrate, and aluminum conductors formed in a plurality of avers on a portion of a main face of the substrate which aluminum conductors comprise aluminum as a main constituent thereof, said aluminum conductors containing copper and nickel to suppress diffusion of said copper between said aluminum conductors, further comprising an insulating film overlying said aluminum conductors on said portion of a main face of the substrate.

20. A semiconductor device comprising a semiconductor substrate, and aluminum conductors formed in a plurality of layers on a portion of a main face of the substrate which aluminum conductors comprise aluminum as a main constituent thereof, said aluminum conductors containing copper and nickel to suppress diffusion of said copper between said aluminum conductors, wherein an interconnect pattern of the aluminum conductors is formed by being etched, and the nickel in the aluminum conductors is of a sufficient amount to prevent a precipitation of the copper in the aluminum conductors so that precipitate containing copper is prevented from remaining during the etching to prevent a short in the interconnect pattern caused by the precipitate containing the copper.

21. A semiconductor device according to claim 20, wherein said aluminum conductors have at least one area in which conductor spacing is not more than 0.4 µm.

22. A semiconductor device comprising:
   a semiconductor substrate,
   a plurality of aluminum conductors formed adjacent to one another on a portion of a main face of the substrate which aluminum conductors comprise aluminum as a main constituent thereof, said aluminum conductors containing copper; and
   means for suppressing diffusion of copper atoms in said aluminum conductors to prevent precipitation of the copper from one of said aluminum conductors to an adjacent one of said aluminum conductors,
   wherein an interconnect pattern of the aluminum conductors is formed by being etched, and the means for suppressing diffusion of copper atoms comprises nickel being provided in the aluminum conductors in a sufficient amount to prevent the precipitation of the copper in the aluminum conductors so that precipitate containing copper is prevented from remaining during the etching to prevent a short in the interconnect pattern caused by the precipitate containing the copper.

23. A semiconductor device according to claim 22, wherein said aluminum conductors have at least one area in which conductor spacing is not more than 0.4 µm.

24. A semiconductor device comprising a semiconductor substrate, and aluminum conductors formed in a plurality of layers on a portion of a main face of the substrate which aluminum conductors comprise aluminum as a main constituent thereof, said aluminum conductors containing copper and nickel to suppress diffusion of said copper between said aluminum conductors, wherein one of the aluminum conductors is electrically connected to the semiconductor substrate through a plug.

25. A semiconductor device comprising a semiconductor substrate, and aluminum conductors formed in a plurality of layers on a portion of a main face of the substrate which aluminum conductors comprise aluminum as a main constituent thereof, said aluminum conductors containing copper and nickel to suppress diffusion of said copper between said aluminum conductors,
   wherein each of the aluminum conductors extends parallel to the main face of the substrate to electrically connect portions on the substrate to each other, which portions are separated from each other along the main face of the substrate.

* * * * *